(12) United States Patent
Asano

(10) Patent No.: US 9,472,698 B2
(45) Date of Patent: Oct. 18, 2016

(54) METHOD OF MANUFACTURING COMPOUND THIN-FILM PHOTOVOLTAIC CELL

(71) Applicant: Solar Frontier K.K., Tokyo (JP)

(72) Inventor: Akihiko Asano, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 0 days.

(21) Appl. No.: 14/654,872

(22) PCT Filed: Dec. 6, 2013

(86) PCT No.: PCT/JP2013/082884
§ 371 (c)(1),
(2) Date: Jun. 23, 2015

(87) PCT Pub. No.: WO2014/103670
PCT Pub. Date: Jul. 3, 2014

(65) Prior Publication Data
US 2016/0197217 A1    Jul. 7, 2016

(30) Foreign Application Priority Data

Dec. 27, 2012 (JP) ................................. 2012-286187

(51) Int. Cl.
H01L 21/00 (2006.01)
H01L 31/0392 (2006.01)
(Continued)

(52) U.S. Cl.
CPC ........ H01L 31/03923 (2013.01); C23C 28/322 (2013.01); C23C 28/34 (2013.01);
(Continued)

(58) Field of Classification Search
CPC ....... H01L 31/0224; B05D 1/38; B05D 3/02; B05D 7/00; B32B 15/04; B32B 17/06
USPC ............... 438/95; 428/623, 630; 427/258; 136/256

See application file for complete search history.

(56) References Cited

U.S. PATENT DOCUMENTS

2009/0081377 A1* 3/2009 Kubo .................. C08F 2/48
427/496
2010/0136769 A1* 6/2010 Keshavarz ............. C08J 3/12
438/478

(Continued)

FOREIGN PATENT DOCUMENTS

JP    S63-155681    6/1988
JP    2004-158511    6/2004

(Continued)

OTHER PUBLICATIONS

Extended European Search Report mailed Jan. 26, 2016.

(Continued)

*Primary Examiner* — Caleb Henry
(74) *Attorney, Agent, or Firm* — IPUSA, PLLC

(57) ABSTRACT

The method of manufacturing a compound thin-film photovoltaic cell includes preparing a metal substrate, whose main constituent is iron, containing aluminium (Al) and chromium (Cr), and forming an insulating layer on an element forming surface of the metal substrate by baking an insulating material; depositing first electrode layer on the insulating layer; depositing a compound light absorption layer on the first electrode layer; and depositing a second electrode layer on the compound light absorption layer, wherein in the forming the insulating layer, an alumina layer is formed at least on a back surface of the metal substrate by thermal oxidation while baking the insulating material.

8 Claims, 3 Drawing Sheets

(51) Int. Cl.
  *C23C 28/00* (2006.01)
  *H01L 31/06* (2012.01)
  *H01L 31/0445* (2014.01)
  *H01L 31/18* (2006.01)

(52) U.S. Cl.
  CPC ...... *C23C 28/345* (2013.01); *H01L 31/03928* (2013.01); *H01L 31/0445* (2014.12); *H01L 31/06* (2013.01); *H01L 31/18* (2013.01); *Y02E 10/541* (2013.01); *Y02P 70/521* (2015.11)

(56) References Cited

U.S. PATENT DOCUMENTS

| | | | | |
|---|---|---|---|---|
| 2010/0229938 | A1* | 9/2010 | Nishino | C25D 7/08 136/256 |
| 2010/0236606 | A1* | 9/2010 | Kobayashi | H01L 31/0322 136/249 |
| 2010/0276001 | A1* | 11/2010 | Sawada | C22C 1/002 136/260 |
| 2012/0006395 | A1* | 1/2012 | Boussaad | C03C 1/008 136/256 |
| 2012/0234391 | A1 | 9/2012 | Boussaad et al. | |
| 2015/0340535 | A1* | 11/2015 | Asano | H01L 31/03923 136/264 |
| 2016/0071988 | A1* | 3/2016 | Asano | H01L 31/03926 136/252 |

FOREIGN PATENT DOCUMENTS

| | | |
|---|---|---|
| JP | 2004-327850 | 11/2004 |
| JP | 2010-263037 | 11/2010 |

OTHER PUBLICATIONS

International Search Report mailed on Feb. 10, 2014.

\* cited by examiner

METHOD OF MANUFACTURING COMPOUND THIN-FILM PHOTOVOLTAIC CELL

BACKGROUND OF THE INVENTION

1. Field of the Invention

The present invention relates to a method of manufacturing a compound thin-film photovoltaic cell.

2. Description of the Related Art

Recently, photovoltaic power generation, for which fuel is unnecessary and that does not eject greenhouse gas, has been receiving a lot of attention. For example, a compound thin-film photovoltaic cell is known in which an inorganic insulating layer and a compound light absorption layer such as a CIS-based thin-film or the like are stacked on a metal substrate such as a stainless substrate or the like.

Here, manufacturing steps of the compound thin-film photovoltaic cell include a process step in which the metal substrate is exposed to high corrosive gas atmosphere such as hydrogen selenide ($H_2Se$), hydrogen sulfide ($H_2S$) or the like. If the metal substrate is corroded, problems such as delamination or interlayer short-circuit of layers that are deposited on the metal substrate thereafter or the like may occur, and such problems cause lowering of characteristics of the compound thin-film photovoltaic cell.

Thus, it is necessary to form a corrosion prevention layer at least on a back surface, which is a main surface of the metal substrate that is exposed to gas atmosphere. As such, retaining corrosion resistance for the metal substrate is an important problem in manufacturing a compound thin-film photovoltaic cell with good characteristics.

Patent Document

[Patent Document 1] Japanese Laid-open Patent Publication No. S63-155681

However, although the importance of the problem of corrosion of the metal substrate in the manufacturing steps of the compound thin-film photovoltaic cell is large, an efficient solution is not found.

For example, for retaining corrosion resistance for the metal substrate, there is a method in which an insulating layer that is formed on an element forming surface of the metal substrate is also formed on a back surface of the metal substrate as a corrosion prevention layer. When the material of the insulating layer is a glass, this method can be easily performed because almost no additional facilities are necessary. However, this method is not efficient in a point of view that waste of running costs increases because the used amount of the material for forming the insulating layer is increased to almost double and baking energy or a step of processing exhaust gas is increased.

Alternatively, for retaining corrosion resistance of the metal substrate, there is a method in which a thin-film such as oxide (SiOx or the like), nitride ($Si_3N_4$ or the like) or the like, or a metal thin-film with high corrosion resistance such as molybdenum (Mo), titanium (Ti) or the like is formed at a back surface of the metal substrate as a corrosion prevention layer. However, this method is not efficient from the point of view that a facility and a material are necessary that are not necessary for the original manufacturing step of a compound thin-film photovoltaic cell. Further, it is hard to deposit such a film on an end surface or the like of the metal substrate, and it is difficult to form a uniform corrosion prevention layer on an entire surface of the metal substrate.

Further, for retaining corrosion resistance of a metal substrate, there is a method of using a stainless substrate to which aluminium is added as the metal substrate (see Patent Document 1, for example). According to this method, pretreatment (heating and oxidizing) at temperature greater than or equal to 850° C. is performed on the metal substrate to form an alumina layer at a surface of the metal substrate as a corrosion prevention layer. However, this method is not efficient from the point of view that a step of forming the alumina layer is necessary, in addition to a general manufacturing step of a compound thin-film photovoltaic cell such as a step of forming an insulating layer or the like. Further, this method is not efficient from the point of view that a specific facility for heating is necessary and energy consumption for the heat treatment is large.

SUMMARY OF THE INVENTION

The present invention is made in light of the above problems, and provides a method of manufacturing a compound thin-film photovoltaic cell capable of efficiently forming a corrosion prevention layer on a metal substrate.

According to an embodiment, there is provided a method of manufacturing a compound thin-film photovoltaic cell, including: preparing a metal substrate, whose main constituent is iron, containing aluminium (Al) and chromium (Cr), and forming an insulating layer on an element forming surface of the metal substrate by baking an insulating material; depositing first electrode layer on the insulating layer; depositing a compound light absorption layer on the first electrode layer; and depositing a second electrode layer on the compound light absorption layer, wherein in the forming the insulating layer, an alumina layer is formed at least on a back surface of the metal substrate by thermal oxidation while baking the insulating material.

According to the disclosed technique, a method of manufacturing a compound thin-film photovoltaic cell capable of efficiently forming a corrosion prevention layer on a metal substrate can be provided.

DETAILED DESCRIPTION OF THE PREFERRED EMBODIMENTS

Figure 1:
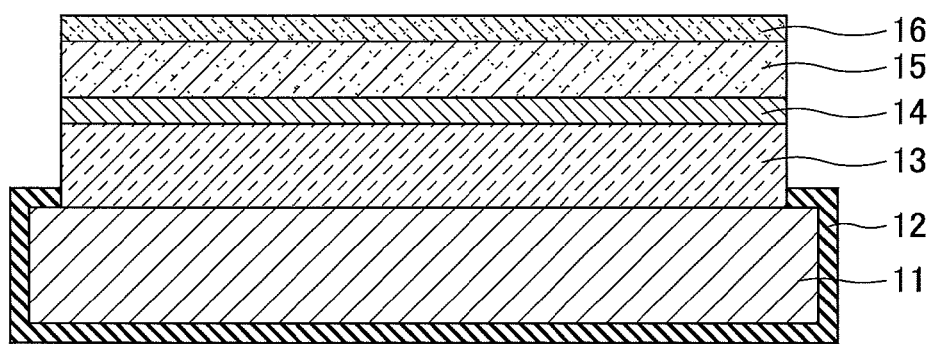
FIG. 1 is a cross-sectional view illustrating an example of a CIS-based compound thin-film photovoltaic cell of an embodiment.

Next, embodiments of the present invention will be described below with reference to drawings. It is to be noted that, in the explanation of the drawings, the same components are given the same reference numerals, and explanations are not repeated.

Here, although a CIS-based compound thin-film photovoltaic cell is exemplified in the following embodiment or the like, the present invention is applicable to a compound thin-film photovoltaic cell other than the CIS-based one. As an example of a compound thin-film photovoltaic cell to which the present invention is applicable, other than the CIS-based one, a CZTS-based compound thin-film photovoltaic cell may be used in which a light absorption layer is composed of a compound including copper (Cu), zinc (Zn), tin (Sn) and a chalcogen element (selenium (Se) or sulfur (S)).

(Structure of CIS-Based Compound Thin-Film Photovoltaic Cell of Embodiment)

FIG. 1 is a cross-sectional view illustrating an example of a CIS-based compound thin-film photovoltaic cell of the embodiment. With reference to FIG. 1, a compound thin-film photovoltaic cell 10 includes a metal substrate 11 including an alumina layer 12 at its surface, an insulating layer 13, a first electrode layer 14, a compound light absorption layer 15 and a second electrode layer 16, in which the insulating layer 13, the first electrode layer 14, the compound light absorption layer 15 and the second electrode layer 16 are stacked on a region of the metal substrate 11 where the alumina layer 12 is not formed in this order. Hereinafter, each component that composes the compound thin-film photovoltaic cell 10 is explained.

Here, in this application, in the substrate and layers that compose the compound thin-film photovoltaic cell 10, a surface at a light receiving side may be referred to as an "upper surface", a surface opposite to this may be referred to as a "lower surface", and a surface connecting the upper surface and the lower surface may be referred to as an "end surface". Further, the entirety of the upper surface, the lower surface and the end surfaces may be referred to as an "entire surface". Further, the upper surface of the metal substrate 11 may be particularly referred to as an "element forming surface", and the lower surface of the metal substrate 11 may be particularly referred to as a "back surface".

The metal substrate 11 is a portion that becomes a base body on which the insulating layer 13, the first electrode layer 14, the compound light absorption layer 15 and the second electrode layer 16 are formed. The metal substrate 11 is a substrate whose main constituent is iron and containing aluminium (Al) and chromium (Cr). A part of the element forming surface of the metal substrate 11 is covered by the alumina layer 12. Further, the entirety of the end surfaces and the back surface of the metal substrate 11 are covered by the alumina layer 12 formed by thermal oxidation. The thickness of the metal substrate 11 may be about 0.2 mm to 0.6 mm, for example.

It is preferable that the content of aluminium (Al) in the metal substrate 11 is greater than or equal to 0.5 weight % and less than or equal to 6.0 weight %. When the content of aluminium (Al) in the metal substrate 11 is less than 0.5 weight %, it is not preferable because the alumina layer 12 is not sufficiently formed. Further, when the content of aluminium (Al) of the metal substrate 11 exceeds 6.0 weight %, it is not preferable because the coefficient of thermal expansion of the metal substrate 11 becomes large.

As an example of the metal substrate 11, a stainless substrate containing aluminium (Al) may be used. It is particularly preferable to use a ferrite-based stainless substrate containing aluminium (Al) as the metal substrate 11. This is because the delamination of the compound light absorption layer at the heat treatment or after the heat treatment can be prevented as the coefficient of thermal expansion of the ferrite-based stainless substrate is close to that of the CIS-based compound light absorption layer.

Here, the stainless substrate is a substrate made of stainless steel. The stainless steel means chromium (Cr) or alloy steel containing chromium (Cr) and nickel (Ni), in which the content of chromium (Cr) is greater than or equal to 10.5%.

Here, the metal substrate 11 is not limited to the stainless substrate containing aluminium (Al), and a substrate whose main constituent is iron and containing aluminium (Al) and less than 10.5% of chromium (Cr) may be used, for example. In this case, the substrate may further include nickel (Ni).

In other words, the substrate whose main constituent is iron and containing aluminium (Al) and chromium (Cr) may include various stainless substrates including a ferrite-based stainless substrate and a substrate containing a kind of metal same as the stainless substrate in which the content of chromium (Cr) is less than 10.5%.

Here, when the content of the chromium (Cr) is too small, there is a possibility that the coefficient of thermal expansion of the metal substrate 11 becomes large or the surface roughness becomes large and it is difficult to use the substrate as a substrate of a photovoltaic cell. Thus, it is preferable that chromium (Cr) is included at least about 8%.

Further, in order to form a further dense alumina layer 12, the metal substrate 11 may include silicon (Si).

The alumina layer 12 covers a part of the element forming surface of the metal substrate 11, specifically, an outer edge portion of the element forming surface of the metal substrate 11 at which the insulating layer 13 is not formed. Further, the alumina layer 12 covers the entirety of the end surfaces and the back surface of the metal substrate 11. Here, the portion of the alumina layer 12 that covers the part of the element forming surface of the metal substrate 11 and the portion of the alumina layer 12 that covers the entirety of the end surfaces and the back surface of the metal substrate 11 are integrally formed.

The alumina layer 12 is formed by diffusion of aluminium (Al) contained in the metal substrate 11 to a predetermined surface of the metal substrate 11 under a predetermined condition. The alumina layer 12 functions as a corrosion prevention layer that prevents the metal substrate 11 from being corroded by high corrosive gas such as hydrogen selenide ($H_2Se$), hydrogen sulfide ($H_2S$) or the like in the manufacturing steps of the compound thin-film photovoltaic cell 10. In a point of view of preventing the corrosion of the metal substrate 11, it is preferable that the thickness of the alumina layer 12 is greater than or equal to 30 nm. Here, as there is no problem even when the alumina layer 12 is thick, the thickness of the alumina layer 12 may be about 1 μm, for example.

Here, when considering that a large part of the element forming surface of the metal substrate 11 is covered by the insulating layer 13 and the area of the end surfaces is small as the thickness of the metal substrate 11 is thin as about 0.2 mm to 0.6 mm, it is considered that the back surface of the metal substrate 11 is the most corrosive surface. Thus, in the manufacturing steps of the compound thin-film photovoltaic cell 10, it is necessary to form the alumina layer 12 at least on the back surface of the metal substrate 11 that is exposed to high corrosive gas atmosphere.

Here, it is preferable that the corrosion prevention layer is formed on the end surfaces or the like of the metal substrate 11 in order to remove a possibility of corrosion from the end surfaces or the like of the metal substrate 11. In this embodiment, as will be described later, as the alumina layer 12 is formed by thermal oxidation, different from forming an alumina layer by a sputtering method or the like, the alumina layer 12 is surely formed on the end surfaces or the like, not only on the back surface, of the metal substrate 11.

The insulating layer 13 is formed at a region of the element forming surface of the metal substrate 11 except the outer edge portion (where the alumina layer 12 is not formed). In other words, the lower surface of the insulating layer 13 only contacts the element forming surface of the metal substrate 11 and does not contact the upper surface of the alumina layer 12. Alternatively, the insulating layer 13 may be formed on the entirety of the element forming surface of the metal substrate 11. In such a case, the alumina layer 12 is not formed on the element forming surface of the metal substrate 11 and the alumina layer 12 is formed on the back surface and the end surfaces.

As the material of the insulating layer 13, it is preferable to use a glass. As an example of the glass, a glass or a low-melting glass may be used whose component is at least one selected from silica ($SiO_2$), CaO, $B_2O_3$, SrO, BaO, $Al_2O_3$, ZnO, $ZrO_2$ and MgO. The reason why the glass is preferably used as the material of the insulating layer 13 is as follows. If organic resin is used as the material of the insulating layer 13, for example, there is a possibility that the insulating layer 13 is damaged by heat treatment when depositing the compound light absorption layer 15. However, by constituting the insulating layer 13 by the glass layer that has high heat resistance, such a problem can be avoided.

Here, the insulating layer 13 may be constituted by a plurality of layers combining the above described materials, and in such a case, the insulating layer 13 may include a layer that has an alkali barrier function. The alkali barrier function is a function to prevent an excessive amount of alkali metal components such as sodium (Na), potassium (K) or the like from being diffused into the compound light absorption layer 15. It is preferable that the thickness of the layer that has the alkali barrier function is about 5 to 100 nm, for example.

It is preferable that the thickness of the insulating layer 13 is more than or equal to 10 μm and less than or equal to 50 μm. Further, it is preferable that the coefficient of linear expansion of the insulating layer 13 is about $9.0 \times 10^{-6}$ to $13.0 \times 10^{-6}$/K. Here, according to the studies by the present inventors, it is revealed that the conversion efficiency of the compound thin-film photovoltaic cell 10 is lowered when the thickness of the insulating layer 13 is less than 10 μm. It is considered that this is because the surface roughness of the upper surface of the metal substrate 11 influences the surface smoothness of each layer formed on the insulating layer 13. Further, it is not preferable to form the thickness of the insulating layer 13 to be greater than 50 μm because the mechanical strength of the insulating layer 13 is lowered or the insulating layer 13 is easily delaminated or peeled from the metal substrate 11.

The first electrode layer 14 is formed on the insulating layer 13. As the material of the first electrode layer 14, molybdenum (Mo) may be used, for example. As the material of the first electrode layer 14, another metal that has high corrosion resistance against hydrogen selenide ($H_2Se$) or hydrogen sulfide ($H_2S$), for example, such as titanium (Ti), tungsten (W) or the like may be used. It is preferable that the thickness of the first electrode layer 14 is about a few dozen nm to a few μm, and may be, for example, 0.5 μm.

The compound light absorption layer 15 is a layer composed of a p-type semiconductor and is formed on the first electrode layer 14. The compound light absorption layer 15 is a portion that photoelectrically converts irradiated sunlight or the like. The photo current generated by the photoelectric conversion of the compound light absorption layer 15 can be extracted as current to outside from an electrode ribbon (copper film ribbon), not illustrated in the drawings, that is attached to either or both of the first electrode layer 14 and the second electrode layer 16 by solder or the like. It is preferable that the thickness of the compound light absorption layer 15 is about a few hundred nm to a few dozen μm, and may be 1.5 μm, for example.

The compound light absorption layer 15 is a semiconductor thin-film and may be formed by a CIS-based compound thin-film composed of IB-IIIB-VIB group elements. The material of the CIS-based compound thin-film may be at least one kind of compound semiconductor including at least one kind of IB group element selected from a group consisting of Cu and Ag, at least one kind of IIIB group element selected from a group consisting of Al, Ga and In, and at least one kind of VIB group element selected from a group consisting of S and Se.

As a specific example of the compound, copper indium 2 selenide ($CuInSe_2$), copper indium 2 sulfide ($CuInS_2$), copper indium 2 sulfide-selenide ($CuIn(SSe)_2$), copper gallium 2 selenide ($CuGaSe_2$), copper gallium 2 sulfide ($CuGaS_2$), copper indium gallium 2 selenide ($Cu(InGa)Se_2$), copper indium gallium 2 sulfide ($Cu(InGa)S_2$), copper indium gallium 2 sulfide-selenide ($Cu(InGa)(SSe)_2$) or the like may be used.

Here, as the compound light absorption layer 15, a CZTS-based compound composed of copper (Cu), zinc (Zn), tin (Sn) and a chalcogen element may be used, for example. As an specific example of the compound, 2 copper zinc tin 4 selenide ($Cu_2ZnSnSe_4$), 2 copper zinc tin 4 sulfide ($Cu_2ZnSnS_4$), 2 copper zinc tin 4 sulfide-selenide ($Cu_2ZnSn(SSe)_4$) or the like may be used.

A buffer layer (not illustrated in the drawings) may be formed on the compound light absorption layer 15. The buffer layer is a high resistance layer that has a function to prevent leakage of current from the compound light absorption layer 15. As the material of the buffer layer, a zinc compound (Zn(S, O, OH)) or the like may be used, for example. As the material of the buffer layer, zinc oxide (ZnO), zinc sulfide (ZnS), indium oxide ($In_2O_3$), indium sulfide (InS), an indium compound (In (S, O, OH)), cadmium sulfide (CdS) or the like may be used. The thickness of the buffer layer may be about a few nm to a few dozen nm, for example.

Here, an alkali barrier layer may be formed between the insulating layer 13 and the first electrode layer 14. The alkali barrier layer is a layer provided for preventing an excessive amount of alkali metal components such as sodium (Na), potassium (K) or the like from being diffused into the compound light absorption layer 15. As the material of the alkali barrier layer, silica ($SiO_2$) or the like may be used, for example. The thickness of the alkali barrier layer may be about 5 to 100 nm, for example.

The second electrode layer 16 is a transparent layer made of an n-type semiconductor, and is formed on the compound light absorption layer 15. The second electrode layer 16 forms a PN junction between the compound light absorption layer 15, which is made of a p-type semiconductor, and further functions as a low resistance conductor. As the second electrode layer 16, a transparent conductive film such as a zinc oxide based thin-film (ZnO), an ITO thin-film, a tin oxide ($SnO_2$) or the like may be used, for example. When the zinc oxide based thin-film (ZnO) is used, it is preferable to add boron (B), aluminium (Al), gallium (Ga) or the like as a dopant so that the film can be made low resistance. The thickness of the second electrode layer 16 may be about 0.5 μm to 2.5 μm, for example.

Here, the compound thin-film photovoltaic cell 10 may be an integrated structure in which a plurality of cells are connected in series.

(Method of Manufacturing CIS-Based Compound Thin-Film Photovoltaic Cell of Embodiment)

Figure 2:
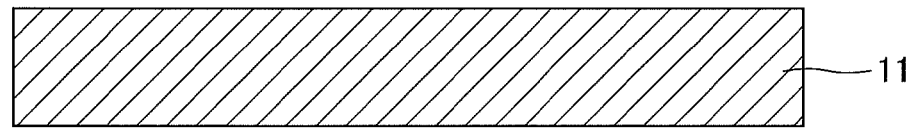
FIG. 2 is a view (No. 1) illustrating an example of manufacturing steps of the CIS-based compound thin-film photovoltaic cell of the embodiment.
Figure 3:
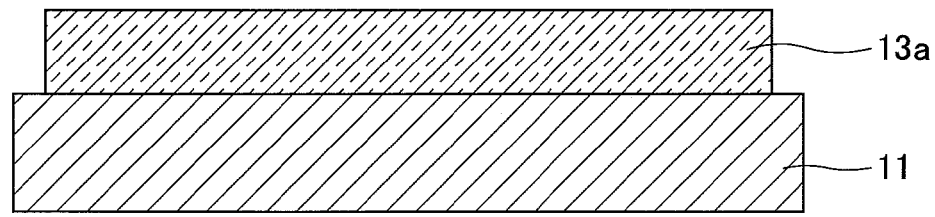
FIG. 3 is a view (No. 2) illustrating an example of manufacturing steps of the CIS-based compound thin-film photovoltaic cell of the embodiment.
Figure 4:
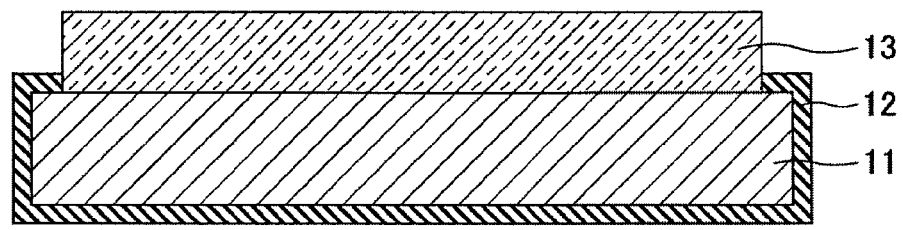
FIG. 4 is a view (No. 3) illustrating an example of manufacturing steps of the CIS-based compound thin-film photovoltaic cell of the embodiment.

Next, a method of manufacturing the CIS-based compound thin-film photovoltaic cell of the embodiment is explained. FIG. 2 to FIG. 4 are views illustrating an example of manufacturing steps of the CIS-based compound thin-film photovoltaic cell of the embodiment.

First, in a step illustrated in FIG. 2, the metal substrate 11 is prepared. The metal substrate 11 is a substrate whose main constituent is iron and containing aluminium (Al) and chromium (Cr). As described above, it is particularly preferable that a ferrite-based stainless substrate containing aluminium (Al) is used as the metal substrate 11. Further, it is preferable that the content of aluminium (Al) in the metal substrate 11 is greater than or equal to 0.5 weight % and less than or equal to 6.0 weight %. The thickness of the metal substrate 11 may be about 0.2 mm to 0.6 mm, for example.

Next, in a step illustrated in FIG. 3, a glass paste 13a whose softening point is within a range of greater than or equal to 600° C. and less than or equal to 800° C. (preferably within a range of greater than or equal to 650° C. and less than or equal to 750° C.) is coated on a predetermined region of the element forming surface of the metal substrate 11 by a slit coater, a spray coater, screen printing, a dip coater, a spin coater or the like. Here, the glass paste 13a is an insulating material that becomes the insulating layer 13 after being baked in the following step.

Next, in a step illustrated in FIG. 4, the glass paste 13a coated in the step illustrated in FIG. 3 is baked to form the insulating layer 13, and while baking, the alumina layer 12 is formed by thermal oxidation of a surface of the metal substrate 11 that is not covered by the glass paste 13a. Specifically, the glass paste 13a coated in the step illustrated in FIG. 3 is heated at about 100° C. to 200° C. in air or in atmosphere including oxygen to dry the glass paste 13a and vaporize organic solvent in the glass paste 13a.

Further, the insulating layer 13 is formed by baking the dried glass paste 13a at the above described temperature within range of greater than or equal to 600° C. and less than or equal to 800° C. (preferably within a range of greater than or equal to 650° C. and less than or equal to 750° C.), which is the softening point, in air or in atmosphere including oxygen. Further, while baking the glass paste 13a, the surface of the metal substrate 11 that is exposed in the temperature atmosphere is oxidized so that the alumina layer 12 that is the corrosion prevention layer provided with a corrosion resistance function is formed. Here, if the baking temperature is less than 600° C., the baking does not proceed sufficiently and if the baking temperature exceeds 800° C., it is difficult to retain the thickness of the insulating layer 13 and there is a possibility that pinholes are generated.

It is preferable that the thickness of the insulating layer 13 after being baked is greater than or equal to 10 μm and less than or equal to 50 μm, and may be about 30 μm, for example. Here, as temperatures for the step of drying the glass paste 13a and the step of baking the glass paste 13a are largely different, those steps may be performed in different apparatuses.

An example of the glass that can be used as the material of the insulating layer 13 is as described above. Further, as described above, the insulating layer 13 may be formed by a plurality of layers, and in such a case, the insulating layer 13 may include a layer that has the alkali barrier function.

The alumina layer 12 is integrally formed at the outer edge portion of the element forming surface of the metal substrate 11 at which the insulating layer 13 is not formed and the entirety of the end surfaces and the back surface of the metal substrate 11. It is sufficient for the alumina layer 12 to be at least formed on the back surface of the metal substrate 11, which is the most corrosive surface, however, in this embodiment, it is possible to form the uniform alumina layer 12 on the end surfaces or the like of the metal substrate 11, at which it was difficult to form by a conventional method. Thus, corrosion resistance of the metal substrate 11 can be further improved. Here, in a point of view of preventing corrosion of the metal substrate 11, it is preferable that the thickness of the alumina layer 12 is greater than or equal to 30 nm.

The compound thin-film photovoltaic cell 10 illustrated in FIG. 1 is completed by stacking the first electrode layer 14, the compound light absorption layer 15 and the second electrode layer 16 on the insulating layer 13 in this order, after the steps illustrated in FIG. 4.

Specifically, the first electrode layer 14 is deposited on the insulating layer 13 by a DC magnetron sputtering method or the like, for example. Alternatively, the first electrode layer 14 may be deposited on the insulating layer 13 by an electron beam evaporation method or the like. The material, the thickness or the like of the first electrode layer 14 is as described above. Here, before depositing the first electrode layer 14, an alkali barrier layer may be formed by a sputtering method or the like. The material, the thickness or the like of the alkali barrier layer is as described above.

Next, copper indium gallium 2 sulfide-selenide (Cu(InGa)(SSe)$_2$) is deposited on the first electrode layer 14 as the compound light absorption layer 15. Copper indium gallium 2 sulfide-selenide (Cu(InGa)(SSe)$_2$) may be deposited by forming a precursor film including copper (Cu), gallium (Ga), indium (In) and the like by a DC magnetron sputtering method, an evaporation method or the like, for example, and thereafter, introducing selenide by hydrogen selenide (H$_2$Se) and sulfide by hydrogen sulfide (H$_2$S) (introduction process of selenide/sulfide) at temperature about 400 to 600° C., for example.

Here, instead of copper indium gallium 2 sulfide-selenide (Cu(InGa)(SSe)$_2$), the above described copper indium 2 selenide (CuInSe$_2$), copper indium 2 sulfide (CuInS$_2$) or the like may be deposited as the compound light absorption layer 15.

Further, the compound light absorption layer 15 may be deposited by vapor depositing copper (Cu), gallium (Ga), indium (In) and selenium (Se). Further, the compound light absorption layer 15 may be deposited by vapor depositing copper (Cu), gallium (Ga), indium (In) and sulfur (S). Further, the compound light absorption layer 15 may be deposited by vapor depositing copper (Cu), gallium (Ga), indium (In), selenium (Se) and sulfur (S). Further, the compound light absorption layer 15 may be deposited by a sputtering method, a hybrid sputtering method, a mechano-chemical process method, a screen printing method, a close-spaced sublimation method, a MOCVD method, a spraying method or the like.

As the portion of the surface of the metal substrate 11 at which the insulating layer 13 is not formed is covered by the alumina layer 12, and there is no portions at which the metal substrate 11 is exposed, corrosion of the entire surface of the metal substrate 11 by hydrogen selenide (H$_2$Se), hydrogen sulfide (H$_2$S) or the like can be suppressed.

Here, after depositing the compound light absorption layer 15, in accordance with the necessity, a buffer layer may be deposited on the compound light absorption layer 15. The buffer layer may be deposited on the compound light absorption layer 15 by a Chemical Bath Deposition method (CBD method), a Metal Organic Chemical Vapor Deposition method (MOCVD method), an Atomic Layer Deposition method (ALD method) or the like, for example. The material, the thickness or the like of the buffer layer is as described above.

Next, the second electrode layer 16 is deposited on the compound light absorption layer 15 by a MOCVD method or the like, for example. Alternatively, the second electrode layer 16 may be formed on the compound light absorption layer 15 using a sputtering method, an evaporation method, an Atomic Layer Deposition method (ALD method) or the like. The material, the thickness or the like of the second electrode layer 16 is as described above. With the above described steps, the CIS-based compound thin-film photovoltaic cell 10 illustrated in FIG. 1 is completed.

Here, separating grooves may be formed in the first electrode layer 14, the compound light absorption layer 15 and the second electrode layer 16 and may form an integrated structure in which cells, which are separated and formed into strip shapes by the separating grooves, are connected in series.

As such, in this embodiment, the insulating layer 13 is formed by coating the glass paste 13a at a predetermined region of the element forming surface of the metal substrate 11 and baking the glass paste 13a, and while baking, the alumina layer 12 is also formed as the corrosion prevention layer at a portion of the surface of the metal substrate 11 that is not covered by the glass paste 13a. With this, without particularly providing a step of forming the corrosion prevention layer, the alumina layer 12 as the corrosion prevention layer can be efficiently and uniformly formed by the same step as forming the insulating layer 13.

In other words, this method is efficient in a point of view that waste of running costs does not occur because the used amount of the glass paste 13a for forming the insulating layer 13 is not increased and baking energy or a step of processing exhaust gas is not increased for retaining the corrosion resistance of the metal substrate 11. Further, as the alumina layer 12 can be formed in the same step as the insulating layer 13, this method is efficient because additional facilities and materials that are unnecessary for the manufacturing steps of the compound thin-film photovoltaic cell 10 are unnecessary. Further, this method is preferable because the uniform corrosion prevention layer can be formed at the end surfaces of the metal substrate 11.

Further, as the metal substrate 11 is not corroded, delamination between the metal substrate 11 and the insulating layer 13 hardly occurs, and a compound thin-film photovoltaic cell with good characteristics can be manufactured. In particular, as the alumina layer is surely formed on the end surfaces or the like, not only on the back surface, by thermal oxidation, a possibility of corrosion from the end surfaces of the metal substrate 11 can be removed and the possibility of delamination between the metal substrate 11 and the insulating layer 13 can be further reduced.

Further, it is possible to form the alumina layer 12 whose thickness is greater than or equal to 30 nm, which is necessary to retain corrosion resistance of the metal substrate 11, within a range of greater than or equal to 600° C. and less than or equal to 800° C. (preferably within a range of greater than or equal to 650° C. and less than or equal to 750° C.). As this temperature range is lower than the temperature range of greater than or equal to 850° C. disclosed in Patent Document 1, the baking energy can be reduced.

Example 1

In Example 1, a corrosion prevention effect of the metal substrate 11 on which the alumina layer 12 is formed was confirmed. First, ferrite-based stainless substrates each containing aluminium (Al) (JFE18-3USR: a ferrite-based stainless substrate containing 3.4% of aluminium) were prepared as the metal substrate 11. The thickness of the prepared metal substrate 11 was 0.3 mm.

Then, a plurality of samples were manufactured in each of which the alumina layer 12 was formed at the entire surface of the respective metal substrate 11. Specifically, three kinds of samples were manufactured including sample 21 for which the baking temperature was 700° C., sample 22 for which the baking temperature was 750° C. and sample 23 for which the baking temperature was 800° C. In each of sample 21 to sample 23, the thickness of the alumina layer 12 was about 30 nm to 100 nm.

Further, as a comparative example, sample 24 that is a stainless substrate containing aluminium but was not baked (the surface of which was not covered by the alumina layer 12), and sample 25 that is a ferrite-based stainless substrate (SUS430) used in a conventional photovoltaic cell module and in which the corrosion prevention layer such as the alumina layer or the like is not formed were prepared.

Then, selenide was introduced by selenide ($H_2Se$) and sulfide was introduced by hydrogen sulfide ($H_2S$) to each of samples 21 to 25 at temperature about 400 to 600° C. Here, in Example 1, the insulating layer 13 or the like was not stacked.

Figure 5:
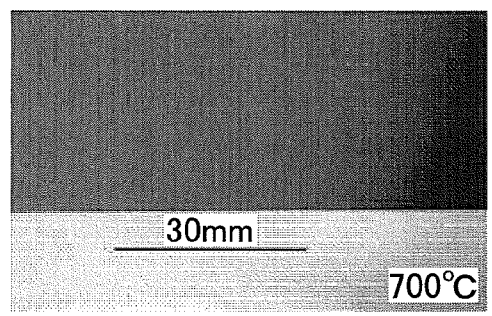
FIG. 5 is a picture (No. 1) of a sample surface manufactured in Example 1.
Figure 6:
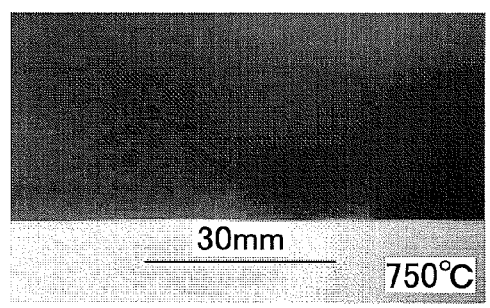
FIG. 6 is a picture (No. 2) of a sample surface manufactured in Example 1.
Figure 7:
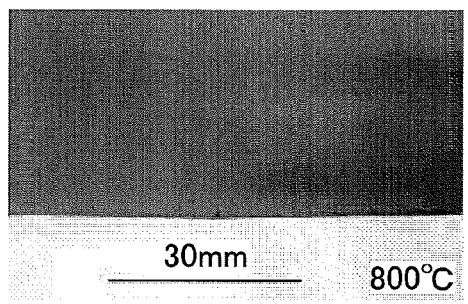
FIG. 7 is a picture (No. 3) of a sample surface manufactured in Example 1.
Figure 8:
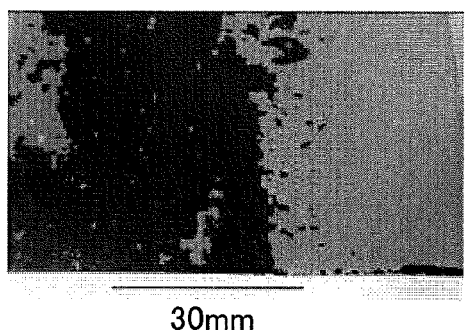
FIG. 8 is a picture (No. 1) of a sample surface manufactured as a comparative example.
Figure 9:
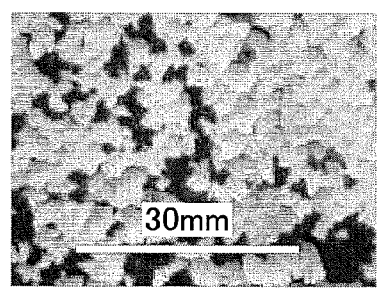
FIG. 9 is a picture (No. 2) of a sample surface manufactured as a comparative example.

FIG. 5 illustrates a picture indicating the surface condition of sample 21, FIG. 6 illustrates a picture indicating the surface condition of sample 22, FIG. 7 illustrates a picture indicating the surface condition of sample 23, FIG. 8 illustrates a picture indicating the surface condition of sample 24, and FIG. 9 illustrates a picture indicating the surface condition of sample 25.

Here, FIG. 5 to FIG. 7 were obtained by placing the metal substrate 11 in which the alumina layer 12 was formed on an orientation plate (a flat plate) and photographing from an upper side, wherein the lower side is the orientation plate (the flat plate) and the upper side is the metal substrate 11 in which the alumina layer 12 is formed at the entire surface. FIG. 8 and FIG. 9 were obtained by placing the metal substrate in which the corrosion prevention layer such as the alumina layer 12 is not formed on the orientation plate (the flat plate) and photographing from the upper side. Further, in FIG. 5 to FIG. 9, the length of the straight line illustrated in the respective drawing corresponds to 30 mm.

As illustrated in FIG. 8 and FIG. 9, it was confirmed that in samples 24 and 25, in which the corrosion prevention layer such as the alumina layer 12 was not formed, the surfaces were ragged due to corrosion so that it was not appropriate for the substrate of the photovoltaic cell. On the other hand, as illustrated in FIG. 5 to FIG. 7, in samples 21 to 23, corrosion was not observed at the entire surface of the metal substrate 11 including the end surfaces.

Example 2

In Example 2, the compound thin-film photovoltaic cell 10 and the comparative sample were manufactured by the manufacturing method as explained above with reference to FIG. 2 to FIG. 4, and the cell characteristics were confirmed or the like.

First, ferrite-based stainless substrates each containing aluminium (Al) (JFE18-3USR: a ferrite-based stainless substrate containing 3.4% of aluminium) were prepared as the metal substrate 11. The thickness of the prepared metal substrate 11 was 0.3 mm.

Then, a plurality of samples were manufactured in each of which the insulating layer 13 was formed by coating the glass paste 13a on the prepared metal substrate 11 and baking, and also the alumina layer 12 was formed while being baked. Specifically, four kinds of samples were manufactured including sample 26 for which the baking temperature was 650° C., sample 27 for which the baking temperature was 700° C., sample 28 for which the baking temperature was 750° C. and sample 29 for which the baking temperature was 800° C. In sample 26 to sample 29, the thickness of the alumina layer 12 was about 30 nm to 100 nm. Further, for each of the samples, the first electrode layer 14, the compound light absorption layer 15 and the second electrode layer 16 were stacked in this order on the insulating layer 13 to manufacture the compound thin-film photovoltaic cell 10.

Further, as a comparative example, a ferrite-based stainless substrate (SUS430) that is used in a conventional photovoltaic cell module was prepared, and a corrosion prevention layer composed of silica was formed on a back surface and end surfaces of the stainless substrate. Further, the insulating layer 13, the first electrode layer 14, the compound light absorption layer 15 and the second electrode layer 16 were stacked on an element forming surface of the stainless substrate to manufacture a compound thin-film photovoltaic cell (sample 30).

As a result, in each of samples 26 to 29 in which the alumina layer 12 was formed by thermal oxidation while baking the insulating layer 13, corrosion of the metal substrate 11 was not observed. Table 1 shows cell characteristics measured for sample 26 to 30. Here, in Table 1, "FF" indicates Fill Factor (FF) that is one of characteristics of a photovoltaic cell.

TABLE 1

| SAMPLE NO. | FORMING TEMPERATURE (° C.) | CELL CHARACTERISTICS | |
|---|---|---|---|
| | | CONVERSION EFFICIENCY (%) | FF |
| 26 | 650 | 13.64 | 0.631 |
| 27 | 700 | 13.65 | 0.641 |
| 28 | 750 | 13.72 | 0.637 |
| 29 | 800 | 13.65 | 0.634 |
| 30 | CONVENTIONAL ONE | 13.79 | 0.65 |

As illustrated in Table 1, cell characteristics of sample 26 to 29 were the same as cell characteristics of sample 30, which has a conventional structure.

It was revealed that the metal substrate including a thin alumina layer (greater than or equal to 30 nm) that was formed by thermal oxidation while baking the insulating layer at temperature for baking the insulating layer, which is lower (within a range of greater than or equal to 600° C. and less than or equal to 800° C.) than temperature (more than or equal to 850° C.) generally used, has a sufficient corrosion prevention effect as the compound thin-film photovoltaic cell, and the compound thin-film photovoltaic cell with characteristics similar to the conventional one can be manufactured.

Although preferred embodiments and examples have been specifically illustrated and described, it is to be understood numerous variations and modifications may be made without departing from the spirit and scope of the present invention.

The present application is based on and claims the benefit of priority of Japanese Priority Application No. 2012-286187 filed on Dec. 27, 2012, the entire contents of which are hereby incorporated by reference.

NUMERALS 10 compound thin-film photovoltaic cell
11 metal substrate
12 alumina layer
13 insulating layer
13a glass paste
14 first electrode layer
15 compound light absorption layer
16 second electrode layer

What is claimed is:

1. A method of manufacturing a compound thin-film photovoltaic cell, comprising:
preparing a metal substrate, whose main constituent is iron, containing aluminium (Al) and chromium (Cr), and forming an insulating layer on an element forming surface of the metal substrate by baking an insulating material;
depositing first electrode layer on the insulating layer;
depositing a compound light absorption layer on the first electrode layer; and
depositing a second electrode layer on the compound light absorption layer,
wherein in the forming the insulating layer, an alumina layer is formed at least on a back surface of the metal substrate by thermal oxidation while baking the insulating material.

2. The method of manufacturing the compound thin-film photovoltaic cell according to claim 1,
wherein the alumina layer is formed on a region of the element forming surface of the metal substrate where the insulating layer is not formed, the back surface and end surfaces of the metal substrate by baking.

3. The method of manufacturing the compound thin-film photovoltaic cell according to claim 1,
wherein the content of aluminium (Al) in the metal substrate is greater than or equal to 0.5 weight % and less than or equal to 6.0 weight %.

4. The method of manufacturing the compound thin-film photovoltaic cell according to claim 1,
wherein the metal substrate is a stainless substrate containing aluminium (Al).

5. The method of manufacturing the compound thin-film photovoltaic cell according to claim 4,
wherein the metal substrate is a ferrite-based stainless substrate containing aluminium (Al).

6. The method of manufacturing the compound thin-film photovoltaic cell according to claim 1,
wherein the insulating layer is a glass layer.

7. The method of manufacturing the compound thin-film photovoltaic cell according to claim 6,
wherein the thickness of the glass layer is greater than or equal to 10 μm and less than or equal to 50 μm.

8. The method of manufacturing the compound thin-film photovoltaic cell according to claim 1, wherein the compound light absorption layer is a CIS-based compound thin-film.

* * * * *